(12) United States Patent
Kanto et al.

(10) Patent No.: US 10,272,869 B2
(45) Date of Patent: Apr. 30, 2019

(54) LIGHT EMITTING DISPLAY DEVICE

(71) Applicant: TOYODA GOSEI CO., LTD., Kiyosu-shi, Aichi-ken (JP)

(72) Inventors: Toru Kanto, Kiyosu (KR); Shinichiro Fuki, Kiyosu (JP); Yuji Kuriyama, Kiyosu (JP)

(73) Assignee: TOYODA GOSEI CO., LTD., Aichi-pref. (JP)

( * ) Notice: Subject to any disclaimer, the term of this patent is extended or adjusted under 35 U.S.C. 154(b) by 8 days.

(21) Appl. No.: 15/628,032

(22) Filed: Jun. 20, 2017

(65) Prior Publication Data
US 2017/0369022 A1  Dec. 28, 2017

(30) Foreign Application Priority Data

Jun. 23, 2016  (JP) ................... 2016-124863

(51) Int. Cl.
| | | |
|---|---|---|
| *B60R 21/215* | (2011.01) | |
| *B60R 21/203* | (2006.01) | |
| *H01L 51/50* | (2006.01) | |
| *H01L 27/32* | (2006.01) | |

(Continued)

(52) U.S. Cl.
CPC .......... *B60R 21/215* (2013.01); *B60Q 1/0082* (2013.01); *H01L 51/50* (2013.01); *B60R 21/205* (2013.01); *B60R 21/2037* (2013.01); *B60R 2021/21537* (2013.01); *B60R 2021/21543* (2013.01); *H01L 27/3206* (2013.01); *H01L 51/5008* (2013.01)

(58) Field of Classification Search
CPC .............. B60R 21/215; B60R 21/2037; B60R 2021/21543; B60Q 1/0082; H01L 51/50
See application file for complete search history.

(56) References Cited

U.S. PATENT DOCUMENTS

| | | | | |
|---|---|---|---|---|
| 4,648,005 A | * | 3/1987 | Brassington | ......... B60Q 1/1484 315/82 |
| 5,203,226 A | * | 4/1993 | Hongou | ................. B60K 35/00 362/460 |

(Continued)

FOREIGN PATENT DOCUMENTS

| | | | |
|---|---|---|---|
| JP | 62122847 A | * | 6/1987 |
| JP | 2009-096450 A | | 5/2009 |

(Continued)

*Primary Examiner* — Faye M Fleming
(74) *Attorney, Agent, or Firm* — Posz Law Group, PLC

(57) ABSTRACT

A light emitting display device, which is applied to a vehicle provided with an airbag device having an airbag accommodated in a folded state and an airbag cover with a shape of covering a vehicle interior of the airbag, the light emitting display device includes: a light emitting display part provided to the airbag cover, the light emitting display part configured to emit light using supplied power; a power feeding device including a power reception coil and a power transmission coil, the power feeding device configured to supply power to the light emitting display part in a non-contact manner, wherein: the power reception coil is provided to the airbag cover in a state of being integrated with the light emitting display part; and the power transmission coil is arranged at a position out of a range, in which the airbag is deployed, when the airbag device is operated.

5 Claims, 10 Drawing Sheets

(51) Int. Cl.
*B60Q 1/00* (2006.01)
*B60R 21/205* (2011.01)

(56) References Cited

U.S. PATENT DOCUMENTS

| | | | | |
|---|---|---|---|---|
| 6,557,662 | B1* | 5/2003 | Andonian | B62D 5/005 |
| | | | | 180/402 |
| 7,786,886 | B2* | 8/2010 | Maruyama | B60K 35/00 |
| | | | | 340/438 |
| 8,564,424 | B2* | 10/2013 | Evarts | B60Q 9/00 |
| | | | | 340/426.24 |
| 9,840,279 | B2* | 12/2017 | Abbas | B62D 1/00 |
| 2006/0028002 | A1* | 2/2006 | Tsujimoto | B60Q 5/003 |
| | | | | 280/731 |

FOREIGN PATENT DOCUMENTS

| | | |
|---|---|---|
| JP | 2014-031088 A | 2/2014 |
| JP | 2016-013763 A | 1/2016 |

\* cited by examiner

LIGHT EMITTING DISPLAY DEVICE

CROSS-REFERENCE TO RELATED APPLICATION(S)

This application is based upon and claims the benefit of priority from Japanese Patent Application No. 2016-124863, filed on Jun. 23, 2016, the entire contents of which are incorporated herein by reference.

BACKGROUND

1. Field of the Invention

The present invention relates to a light emitting display device in which a light emitting display part for emitting light using electricity is provided to an airbag cover.

2. Description of the Related Art

A steering wheel of a vehicle such as an automobile is provided with an airbag device for protecting a driver. The airbag device has an airbag accommodated in the steering wheel in a folded state, and an airbag cover that covers a vehicle interior (a driver seat side) of the airbag. When the airbag device is operated, the airbag is expanded while breaking the airbag cover and is deployed to an exterior of the steering wheel.

As with a light emitting display device disclosed in JP-A-2009-96450, there has been proposed that a light emitting display part for emitting light using supplied power is provided to an airbag cover in order to improve a design property of a steering wheel.

In the light emitting display device of JP-A-2009-96450, it is necessary to provide power to the light emitting display part provided to the airbag cover, but a wiring for supplying the power is arranged to be connected to the light emitting display part through a space between the received airbag and the airbag cover. Since the wiring easily becomes an obstacle when the airbag is deployed, it is one of limitations in setting the deployment shape of the airbag.

As well as the device in which the light emitting display part is provided to the airbag cover of the steering wheel as described above, in a light emitting display device in which the light emitting display part is provided to an airbag cover of a vehicle interior such as an airbag cover of a dashboard, the actual circumstances related to the power supply wiring are already common.

SUMMARY

An object of the present invention is to provide a light emitting display device having a structure hardly becoming an obstacle when an airbag is deployed.

According to an aspect of the present invention, there is provided a light emitting display device, which is applied to a vehicle provided with an airbag device having an airbag accommodated in a folded state and an airbag cover with a shape of covering a vehicle interior of the airbag, the light emitting display device including: a light emitting display part provided to the airbag cover, the light emitting display part configured to emit light using supplied power; a power feeding device including a power reception coil and a power transmission coil, the power feeding device configured to supply power to the light emitting display part in a non-contact manner, wherein: the power reception coil is provided to the airbag cover in a state of being integrated with the light emitting display part; and the power transmission coil is arranged at a position out of a range, in which the airbag is deployed, when the airbag device is operated.

According to the aforementioned configuration, since the power transmission coil is arranged at a position out of the deployment range of the airbag, the power transmission coil does not become an obstacle when the airbag is deployed. In addition, since power is supplied to the light emitting display part using the power reception coil and the power transmission coil in a non-contact manner, there is no wiring for power supply between the power reception coil and the power transmission coil (between the airbag in the folded state and the airbag cover), so that the wiring for power supply does not become an obstacle in the deployment of the airbag. Consequently, although the light emitting display part is provided to the airbag cover, it is possible to achieve a structure in which the light emitting display device employing the light emitting display part as one configuration hardly becomes an obstacle when the airbag is deployed.

In the light emitting display device of the present invention, the airbag device may be provided to a steering wheel of the vehicle.

In the aforementioned configuration, since the airbag device and the light emitting display device are provided in a narrow range, the degree of freedom of the arrangement of these devices is low. Therefore, when the wiring for power supply is provided, the wiring does not become an obstacle when the airbag is deployed. According to the aforementioned configuration, it is possible to achieve a structure in which the light emitting display device hardly becomes an obstacle when the airbag is deployed, wherein in the light emitting display device, the airbag device is provided to the steering wheel.

In the light emitting display device of the present invention, the power transmission coil may be provided to the airbag cover.

According to the aforementioned configuration, the power reception coil and the power transmission coil are provided to the airbag cover, so that the power reception coil and the power transmission coil can be arranged at a near position. Therefore, it is possible to perform high efficient power transmission using the power reception coil and the power transmission coil.

In the light emitting display device of the present invention, the airbag cover may have a cylindrical peripheral wall, which is provided to protrude at a surface of a side of the airbag to surround a periphery of the airbag, the power transmission coil may be provided to extend outside the peripheral wall, and the power reception coil and the light emitting display part may be provided inside the peripheral wall.

A cylindrical peripheral wall is provided to the airbag cover to allow the airbag to pass through when the airbag is deployed. According to the aforementioned configuration, the power transmission coil is provided outside the peripheral wall of the airbag cover, so that the power transmission coil can be arranged at a position out of the deployment range of the airbag. Furthermore, power can be transmitted from the power transmission coil to the power reception coil and the light emitting display part provided inside of the peripheral wall.

In the light emitting display device of the present invention, the power transmission coil may be arranged to extend along an outer edge of the airbag cover.

According to the aforementioned configuration, the power transmission coil can be arranged to surround almost the entire of the airbag cover, so that it is possible to increase a range in which power can be transmitted using the power transmission coil and thus it is possible to perform power transmission with high degree of freedom.

The light emitting display device of the present invention may further include: a power change unit configured to change a supply mode of power to the power transmission coil, and a light emitting change unit configured to change a light emitting mode of the light emitting display part according to power received by the power reception coil.

According to the aforementioned configuration, the supply mode (in detail, a supply voltage, a frequency and the like) is adjusted according to the supply of power to the power transmission coil, so that it is possible to set the light emitting mode of the light emitting display part with high degree of freedom, such as switching of turning-on and turning-off of the light emitting display part and a change in the light emitting mode (for example, a light emitting color and a light emitting pattern) at the time of the turning-on of the light emitting display part.

In the light emitting display device of the present invention, the light emitting display part may include an emblem and a light emitting diode for allowing the emblem to emit light.

According to the present invention, it is possible to provide a light emitting display device having a structure hardly becoming an obstacle when an airbag is deployed.

BRIEF DESCRIPTION OF THE DRAWINGS

The present invention will become more fully understood from the detailed description given hereinbelow and the accompanying drawing which is given by way of illustration only, and thus is not limitative of the present invention and wherein.

DETAILED DESCRIPTION OF THE INVENTION

Hereinafter, an embodiment of a light emitting display device will be described.

Figure 1:
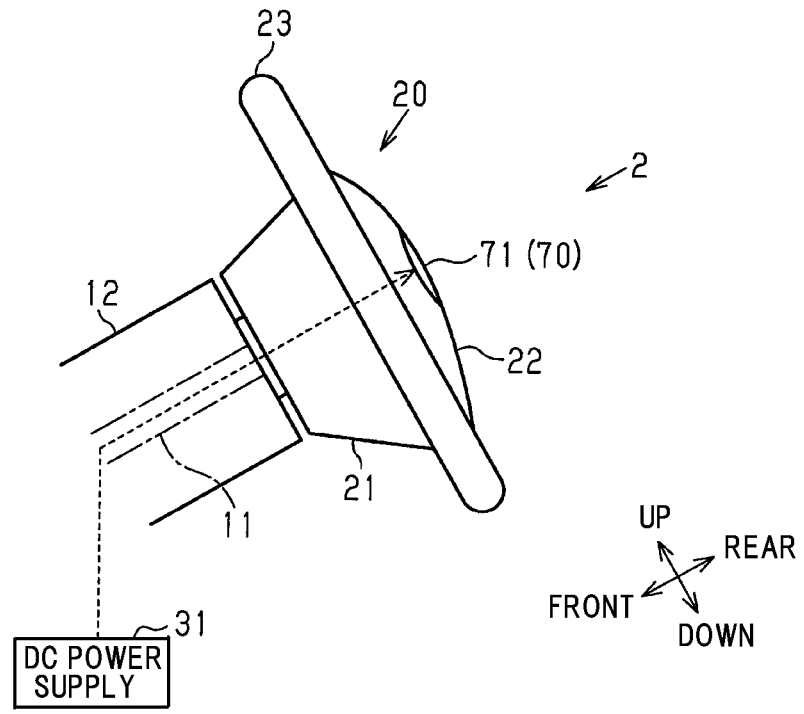
FIG. 1 is a side view of a steering wheel to which a light emitting display of one embodiment is applied.
Figure 2:
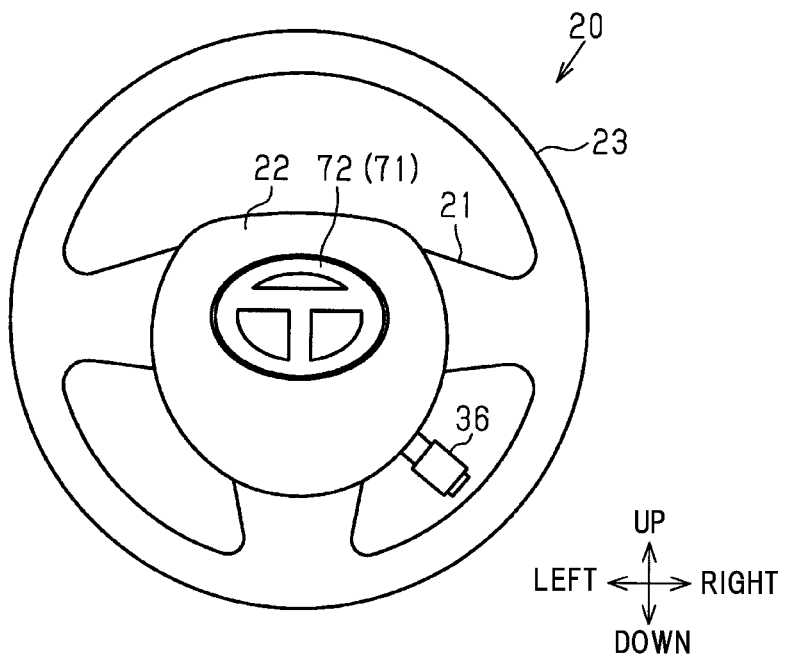
FIG. 2 is a view of the steering wheel viewed in the direction of the arrow 2.

As illustrated in FIGS. 1 and 2, at the front side (the right side of FIG. 1) from a driver seat of a vehicle, a steering column 12 enclosing a steering shaft 11 serving as a steering axle is arranged. The steering shaft 11 is arranged in an inclined state so as to be positioned higher than that of the driver seat side (the left side of FIG. 1). At an end portion of the driver seat side of the steering shaft 11, a steering wheel 20 is mounted to be integrally rotatable.

Hereinafter, a direction along a rotating axis of the steering shaft 11 is referred to as a "front and rear direction" of the steering wheel 20, and a direction in which the steering wheel 20 is erected among directions along a plane perpendicular to the rotating axis is referred to as an "up and down direction". Consequently, the front and rear direction and the up and down direction of the steering wheel 20 are slightly inclined with respect to a front and rear direction (a horizontal direction) and an up and down direction (a vertical direction) of the vehicle.

The steering wheel 20 includes a wheel body 21, which is a part rotationally operated by a driver when a progress direction of the vehicle is changed, and an additional equipment 22 integrally mounted at a center part of the wheel body 21. The additional equipment 22 includes a light emitting display device having a light emitting display part 71 for emitting light using supplied power, and an airbag device.

Hereinafter, an electrical circuit including the light emitting display device and the airbag device will be described.

Figure 3:
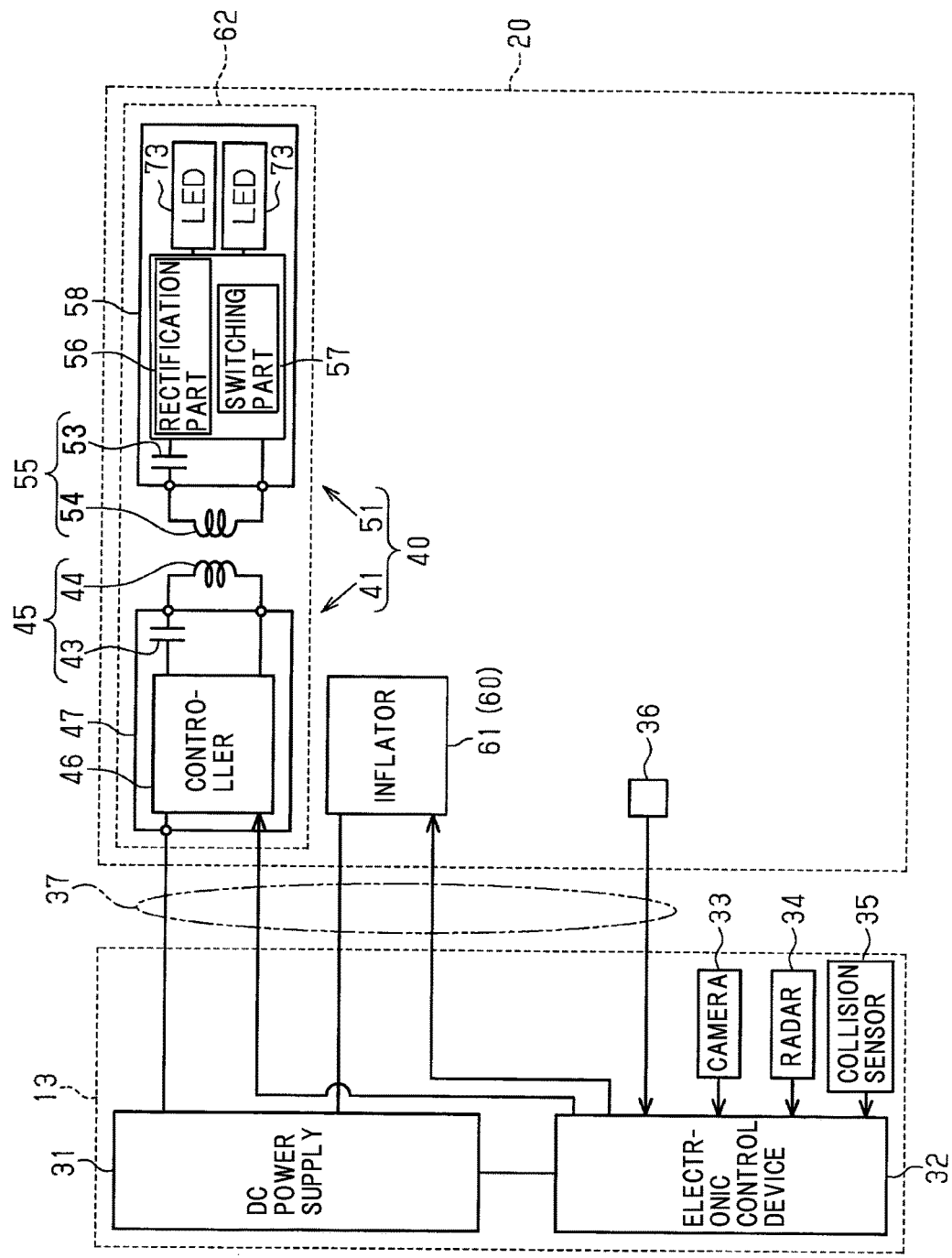
FIG. 3 is a block diagram illustrating an electrical circuit of a vehicle.

As illustrated in FIG. 3, a vehicle body 13 is provided with a DC power supply 31 that supplies power to each element of the vehicle and an electronic control device 32 in which a microcomputer is configured as a main element. The vehicle body 13 is further provided with a camera 33 that captures the front of the vehicle, and various sensors such as a radar sensor 34 for detecting a distance between a peripheral obstacle and the vehicle and a collision sensor 35 for detecting the presence or absence of a collision of the vehicle. Detection signals of these sensors are received in the electronic control device 32. Then, the electronic control device 32 performs various arithmetic calculations based on the detection signals of the sensors, and controls the operation of an airbag device 60 and a display mode (in detail, a light emitting color) of the light emitting display part 71 based on the arithmetic calculation results.

The wheel body 21 (see FIG. 2) of the steering wheel 20 is provided with an automatic driving switch 36. The automatic driving switch 36 is a switch which is turned on by a crew member when automatic driving of the vehicle is performed, and is connected to the electronic control device 32. In the automatic driving, basically, vehicle driving control, such as operation control of the steering wheel 20 and driving control of a vehicle driving source (for example, an internal combustion engine), is automatically performed by the electronic control device 32 based on the detection signals of the sensors without the driving operation of the crew member.

The additional equipment 22 of the steering wheel 20 is provided with a wireless power feeding device 40 for supplying power to the light emitting part 71 (in detail, light emitting diodes 73 serving as light emitting parts thereof) in a non-contact manner.

A power transmission unit 41 of the wireless power feeding device 40 has a capacitor 43, and a coil for power transmission (a power transmission coil 44) including an annular conductor (a copper wire). These capacitor 43 and power transmission coil 44 constitute a power transmission side resonator 45 in the wireless power feeding device 40. The power transmission unit 41 has a controller 46 embedded with a switching circuit and a circuit controller for controlling the operation of the switching circuit. In the power transmission unit 41, the aforementioned DC power supply 31 and the resonator 45 are connected to each other through the controller 46. The controller 46 is connected to the DC power supply 31 and the electronic control device 32, which are provided in the vehicle body 13, through a wire harness 37. The power transmission unit 41 generates a trapezoidal wave voltage with a predetermined cycle through operation control of the controller 46 (in detail, the switching circuit) based on a command signal from the electronic control device 32, and applies the trapezoidal wave voltage to the resonator 45. In this way, a sinusoidal current flows through the power transmission coil 44 of the resonator 45. The power transmission unit 41 of the wireless power feeding device 40 is actually configured with two members of a power transmission board 47 having the capacitor 43 and the controller 46, and the power transmission coil 44.

A power reception unit 51 of the wireless power feeding device 40 has a capacitor 53, and a coil for power reception (a power reception coil 54) including an annular conductor (a copper wire). These capacitor 53 and power reception coil 54 constitute a power reception side resonator 55 in the wireless power feeding device 40. The power reception unit 51 has a rectification part 56 that converts a sinusoidal current flowing through the resonator 55 (in detail, the power reception coil 54) into a DC current, and a switching part 57 that switches a light emitting color of the light emitting diode 73 according to a voltage (in detail, a voltage of DC power after being rectified by the rectification part 56) supplied from the power transmission unit 41. In the power reception unit 51, the resonator 55 and the light emitting diode 73 are connected to each other through the rectification part 56 and the switching part 57. The DC power rectified by the rectification part 56 is supplied to the light emitting diode 73 through the switching part 57, so that the light emitting diode 73 emits light. The power reception unit 51 of the wireless power feeding device 40 is actually configured with two members of a power reception board 58 having the capacitor 53, the rectification part 56, the switching part 57 and the light emitting diode 73, and the power reception coil 54.

In the wireless power feeding device 40, when the operation control of the controller 46 of the power transmission unit 41 is performed based on the command signal from the electronic control device 32, the sinusoidal current flows through the power transmission coil 44. In this way, the resonator 45 of the power transmission unit 41 and the resonator 55 of the power reception unit 51 are coupled to each other by resonating with each other, so that high frequency power (in detail, the sinusoidal current) supplied to the resonator 45 of the power transmission unit 41 is transferred to the resonator 55 of the power reception unit 51. The high frequency power transferred to the resonator 55 of the power reception unit 51 is converted into DC power by the rectification part 56 of the power reception unit 51 and is supplied to the light emitting diode 73 through the switching part 57. In this case, the light emitting diode 73 emits light with a color corresponding to a voltage of the DC power rectified by the rectification part 56.

In the wireless power feeding device 40, when the automatic driving switch 36 is turned on and the automatic driving of the vehicle is performed, power is supplied to the light emitting display part 71, so that the light emitting diode 73 is turned on.

In detail, when the driving state of the vehicle is an assumed state (a reference state) during the execution of the automatic driving, the operation control of the controller 46 of the power transmission unit 41 is performed such that the voltage of the DC power after the rectification by the rectification part 56 reaches a predetermined voltage V1 (for example, 3.0 V). In this way, when the voltage of the DC power after the rectification reaches the predetermined voltage V1, the predetermined voltage V1 is input to the switching part 57, so that power for allowing the light emitting diode 73 to emit light with a "blue" is supplied to the light emitting diode 73 from the switching part 57. Consequently, in this case, the light emitting display part 71 emits the light with the blue.

When the driving state of the vehicle deviates from the aforementioned reference state such as when an inter-vehicle distance is shorter than a default value and holding of a traffic lane is not possible in the automatic driving, the operation control of the controller 46 of the power transmission unit 41 is performed such that the voltage of the DC power after the rectification by the rectification part 56 reaches a predetermined voltage V2 (for example, 2.0 V). In this way, when the voltage of the DC power after the rectification reaches the predetermined voltage V2, the predetermined voltage V2 is input to the switching part 57, so that power for allowing the light emitting diode 73 to emit light with a "red" is supplied to the light emitting diode 73 from the switching part 57. Therefore, in this case, the light emitting display part 71 emits the light with the red.

In the present embodiment, the electronic control device 32 corresponds to a power change unit that changes a supply mode of power to the power transmission coil 44, and the switching part 57 corresponds to a light emitting change unit that changes a light emitting mode of the light emitting display part 71 according to power received by the power reception coil 54.

According to the light emitting display device of the present embodiment, a crew member is notified of the fact that automatic driving is being performed by the turning-on of the light emitting display part 71. Furthermore, the light emitting color of the light emitting display part 71 is changed from the blue to the red while the automatic driving is being performed, so that a crew member is notified of the fact that the driving state of the vehicle deviates from the reference state. Such a light emitting display part 71 is provided to the center part of the steering wheel 20, so that it is possible to allow a crew member seated at a driver seat to accurately recognize vehicle information at the time of the automatic driving.

In addition, when the automatic driving switch 36 is turned off, that is, when the automatic driving of the vehicle is not performed, since no power is supplied from the wireless power feeding device 40, the light emitting diode 73 is turned off.

Furthermore, the additional equipment 22 of the steering wheel 20 has an inflator 61 that generates gas for airbag expansion. The inflator 61 is connected to the DC power supply 31 and the electronic control device 32 through the wire harness 37. When a collision of the vehicle is not detected by the collision sensor 35, the inflator 61 does not operate, so that the airbag is held in the folded state. When a collision of the vehicle is detected by the collision sensor 35, the inflator 61 operates to generate the gas for airbag expansion based on the command signal from the electronic control device 32, so that the airbag is expanded and deployed.

Hereinafter, the structure of the additional equipment 22 of the steering wheel 20 will be described in detail.

Figure 4:
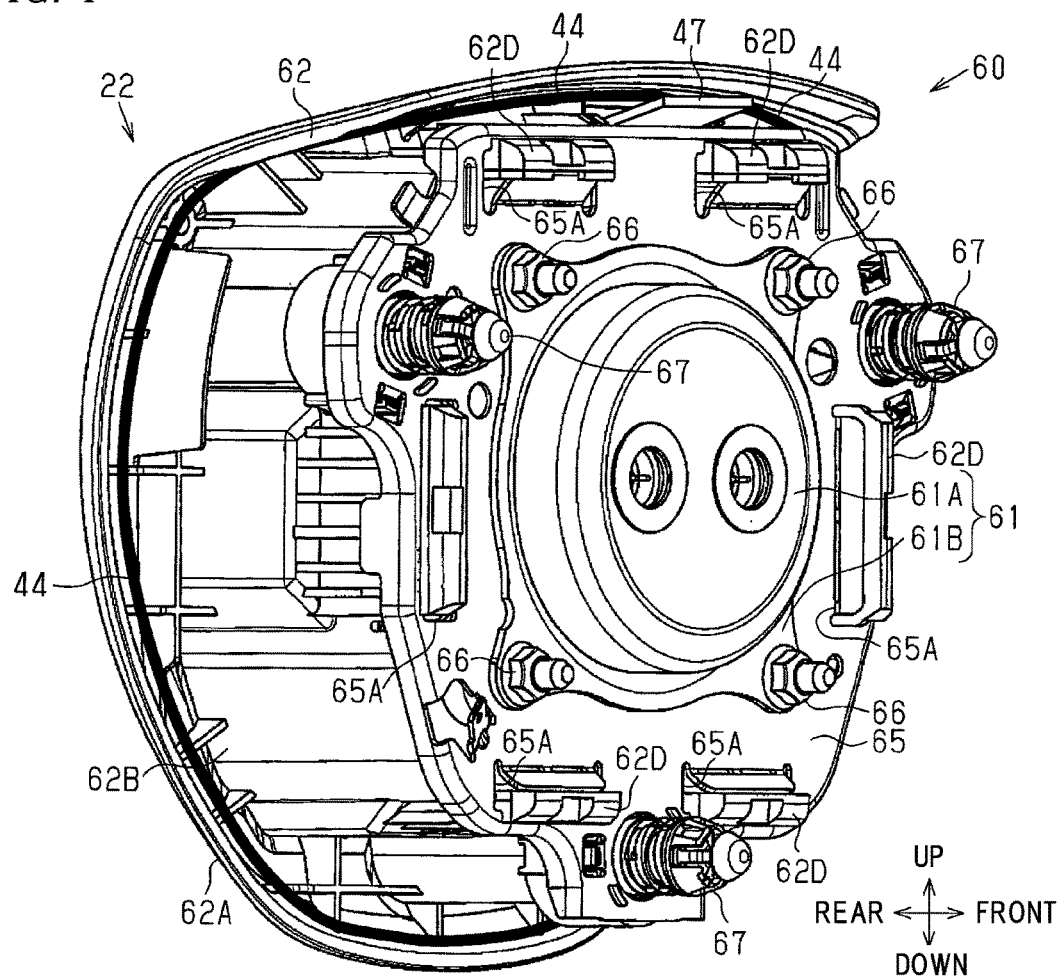
FIG. 4 is a perspective view of an additional equipment of the steering wheel.
Figure 5:
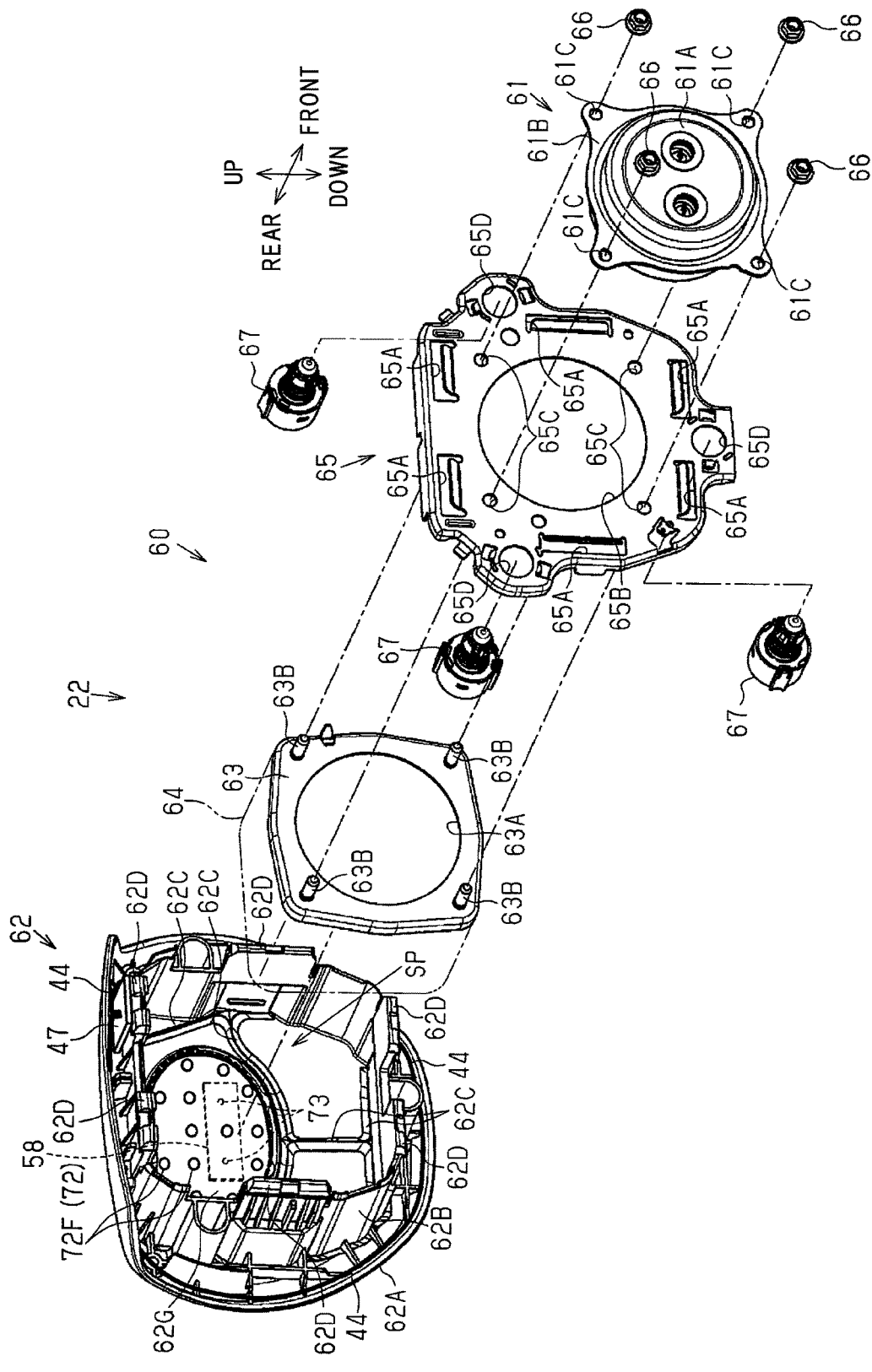
FIG. 5 is an exploded perspective view of the additional equipment.

As illustrated in FIGS. 4 and 5, the additional equipment 22 has the airbag device 60. The airbag device 60 is configured by assembling the inflator 61, an airbag cover 62, a ring retainer 63, and an airbag 64 (see FIG. 5) to a bag holder 65.

The airbag cover 62 has an outer skin 62A in which a surface (a rear surface) forms a design surface, and an approximately rectangular tubular-like peripheral wall 62B vertically installed on a back surface (a front surface) of the outer skin 62A. In a space (a bag accommodating space SP (FIG. 5)) surrounded by the outer skin 62A, the peripheral wall 62B, and the bag holder 65, the airbag 64 folded to be expandable and deployable is accommodated. As described above, the airbag cover 62 is formed in a shape for covering the vehicle interior (the rear side) of the airbag 64 in the folded state.

Figure 6B:
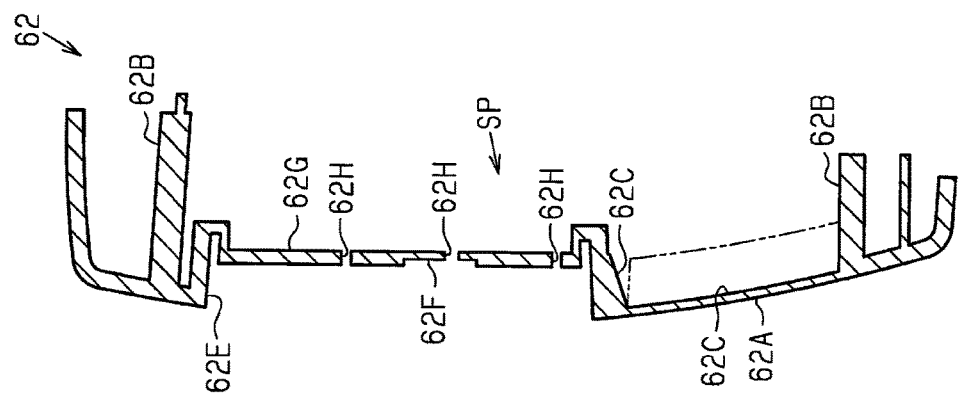
FIG. 6B is a sectional view taken along line 6b-6b of FIG. 6A.
Figure 6A:
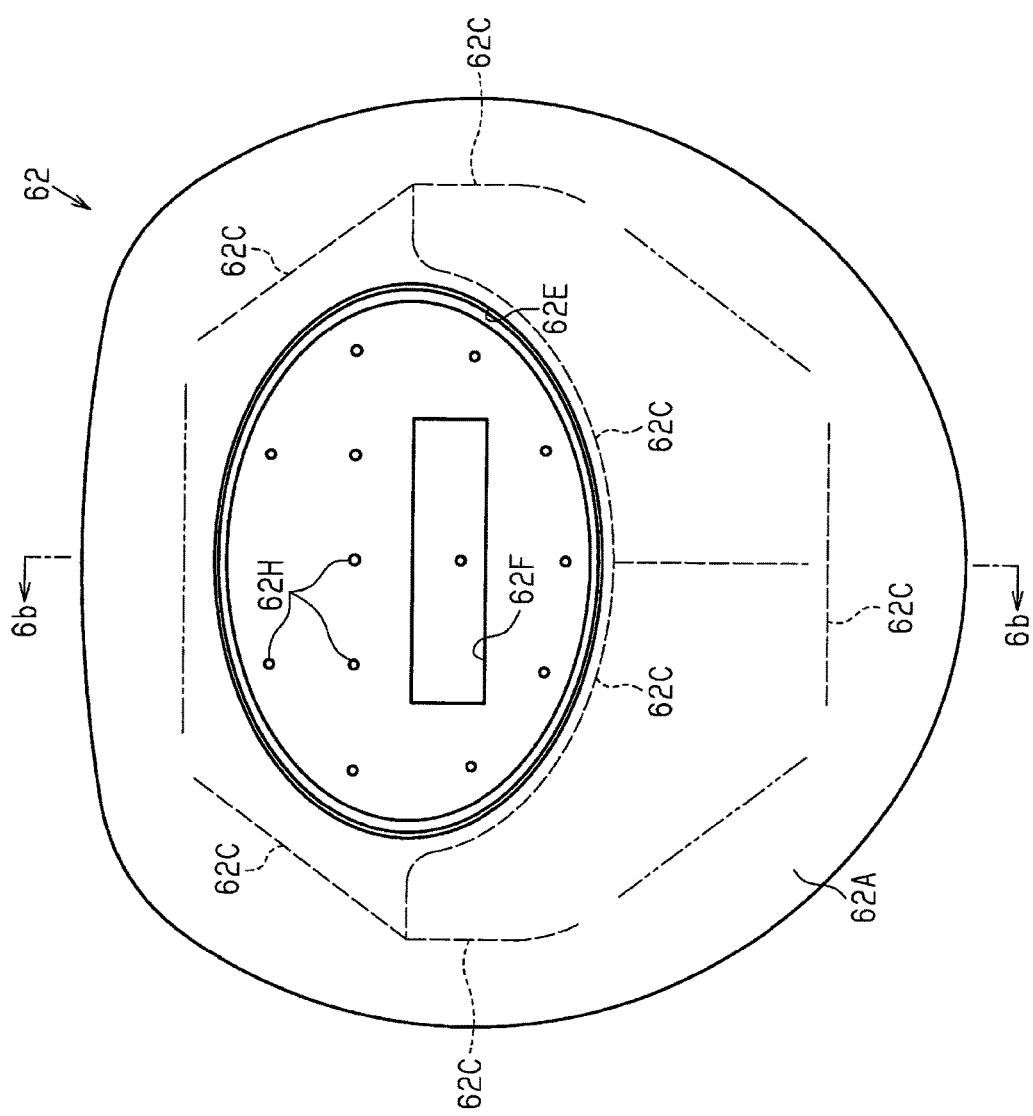
FIG. 6A is a front view of an airbag cover.

As illustrated in FIGS. 6A and 6B, at a part for partitioning and forming the aforementioned bag accommodating space SP (FIG. 6B) at the outer skin 62A of the airbag cover 62, a part (a thin part 62C) with a thickness thinner than that of an adjacent part is formed. When the airbag 64 (see FIG. 5) is expanded and deployed, the airbag 64 passes through the inside of the peripheral wall 62B, breaks through the thin part 62C of the outer skin 62A, pushes to open the outer skin 62A to the vehicle interior, and then protrudes to the exterior of the airbag cover 62. In FIG. 6A, a broken line indicates a part at which the thin part 62C extends, and a two dot chain line indicates a part at which the thin part 62C is folded when the outer skin 62A is pushed to open. As illustrated in FIG. 6A, the extension shape of the thin part 62C is a shape in which the outer skin 62A is vertically two-divided by the expanded airbag 64, the upper portion thereof is pushed to open upward, and the lower portion thereof is laterally two-divided, so that the outer skin 62A can be deformed to be laterally opened.

As illustrated in FIGS. 4 and 5, at a front end portion of the peripheral wall 62B of the airbag cover 62, a plurality of locking claws 62D having a rectangular plate shape are integrally formed.

The aforementioned bag holder 65 is formed by pressing a metal plate. At outer edges of the bag holder 65, slit-like claw locking holes 65A are formed corresponding to the front sides of the locking claws 62D of the aforementioned airbag cover 62. The front end portions of the locking claws 62D of the airbag cover 62 are inserted and locked to the claw locking holes 65A, so that the airbag cover 62 is locked to the bag holder 65. The bag holder 65 is formed at the center part thereof with an opening 65B (FIG. 5) having a circular shape. At a plurality of positions of inner edges of the opening 65B, screw insertion holes 65C are respectively formed.

The inflator 61 has a body 61A having a low cylindrical shape. At an outer peripheral surface of the body 61A, a flange part 61B protrudes radially outside across the entire periphery thereof. In the flange part 61B, screw insertion holes 61C are respectively formed corresponding to the front sides of the screw insertion holes 65C of the aforementioned bag holder 65. The inflator 61 has a gas injection hole for injecting gas for expansion in correspondence to a rear side from the flange part 61B. The body 61A of the inflator 61 is inserted through the opening 65B of the bag holder 65 from the front side such that the gas injection hole is opened to the inside of the aforementioned bag accommodating space SP. In the state in which the flange part 61B of the inflator 61 contacts with a peripheral edge of the opening 65B of the bag holder 65, the inflator 61 is mounted at the bag holder 65 together with the ring retainer 63.

The ring retainer 63 has an opening 63A, which has approximately the same shape as that of the opening 65B, in correspondence to the rear side of the opening 65B of the bag holder 65. The ring retainer 63 further has a plurality of mounting screws 63B in correspondence to the rear sides of the screw insertion holes 65C of the bag holder 65. Between the ring retainer 63 and the bag holder 65, the opening of the airbag 64 in the folded state is arranged. The mounting screws 63B of the ring retainer 63 are inserted from the rear side into screw insertion holes (not illustrated), which are provided at the inner edges of the opening of the airbag 64, and the screw insertion holes 65C and 61C of the bag holder 65 and the inflator 61. Nuts 66 are fastened to the inserted mounting screws 63B from the front side, so that the airbag 64 is fixed to the bag holder 65 through the ring retainer 63 and the inflator 61 is fixed to the bag holder 65.

The bag holder 65 is formed at the outer edges thereof with a plurality of mounting holes 65D. To these mounting holes 65D, engaging pin mechanisms 67 are respectively fixed. The engaging pin mechanisms 67 are engaged with snap pins mounted at the wheel body 21 (see FIG. 2), so that the additional equipment 22 is mounted at the wheel body 21.

Figure 7A:
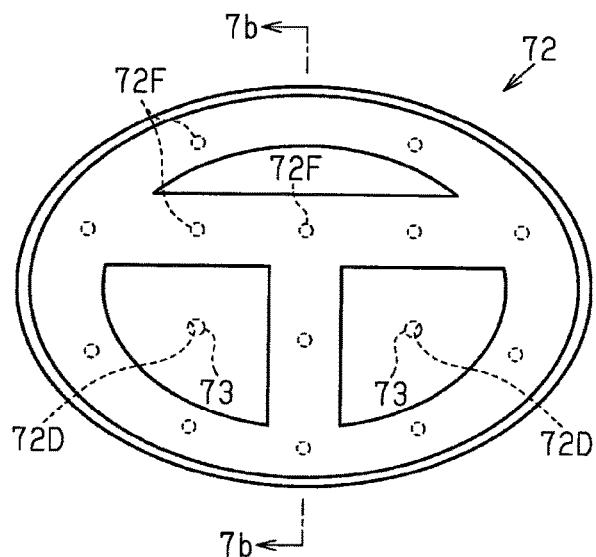
FIG. 7A is a front view of an emblem part cover.

As illustrated in FIGS. 7A. 7B, and 8, the airbag cover 62 is provided with the light emitting display part 71. The light emitting display part 71 includes an emblem part 72, in which parts (an outer layer part 72A and a decoration layer 72B) of the rear side (the left side of FIG. 8) serve as an emblem, and the light emitting diode 73 mounted at a part (the right side of FIG. 8) of the front side of the emblem part 72.

Figure 7B:
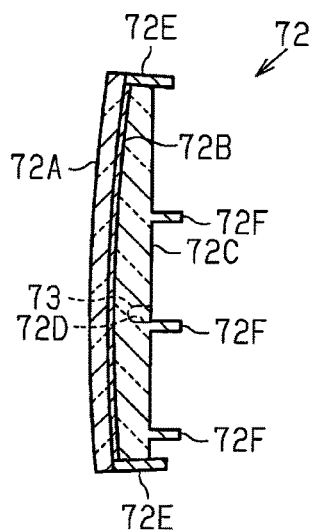
FIG. 7B is a sectional view taken along line 7b-7b of FIG. 7A.

As illustrated in FIGS. 7A and 7B, the emblem part 72 has an approximately oval section formed in a plate shape.

The outer layer part 72A of the emblem part 72 is made of a transparent resin material and on the front surface of the outer layer part 72A the decoration layer 72B with a drawn mark surrounding the periphery of a character T with an oval is formed. In the decoration layer 72B, the mark part (the character part and the part surrounded by the oval) is configured by a metal plating layer. In this way, the mark part in the decoration layer 72B has a half mirror structure for allowing light from the front side of the emblem part 72 to pass therethrough and preventing light from the rear side of the emblem part 72 from passing therethrough. In the decoration layer 72B, a part, other than the mark, is configured by a coating layer including a black paint. In this way, the part, other than the mark, in the decoration layer 72B has a structure for preventing light from passing therethrough.

A part (an inner layer part 72C) of the front side of the emblem part 72 is made of a transparent resin material. At positions serving as the rear side of the aforementioned decoration layer on the rear surface of the inner layer part 72C, a plurality of (two in the present embodiment) insertion holes 72D are formed. Into these insertion holes 72D, the aforementioned light emitting diodes 73 are respectively inserted. The emblem part 72 has a structure in which, when the light emitting diodes 73 emit light, the light is spread in the inner layer part 72C and passes through the outer layer part 72A side through the plating layer of the half mirror structure. By such a structure, the entire emblem part 72 is configured to emit light.

The emblem part 72 has a peripheral wall 72E which protrudes in an annular shape rearward from the outer edge end of the outer layer part 72A and extends to surround the periphery of the inner layer part 72C. The peripheral wall 72E is made of a colored (a black in the present embodiment) resin material. The emblem part 72 has a plurality of (13 in the present embodiment) legs 72F protruding in a cylindrical shape forward from the front surface of the inner layer part 72C. These legs 72F are integrally formed with the inner layer part 72C of a transparent resin material.

Figure 8:
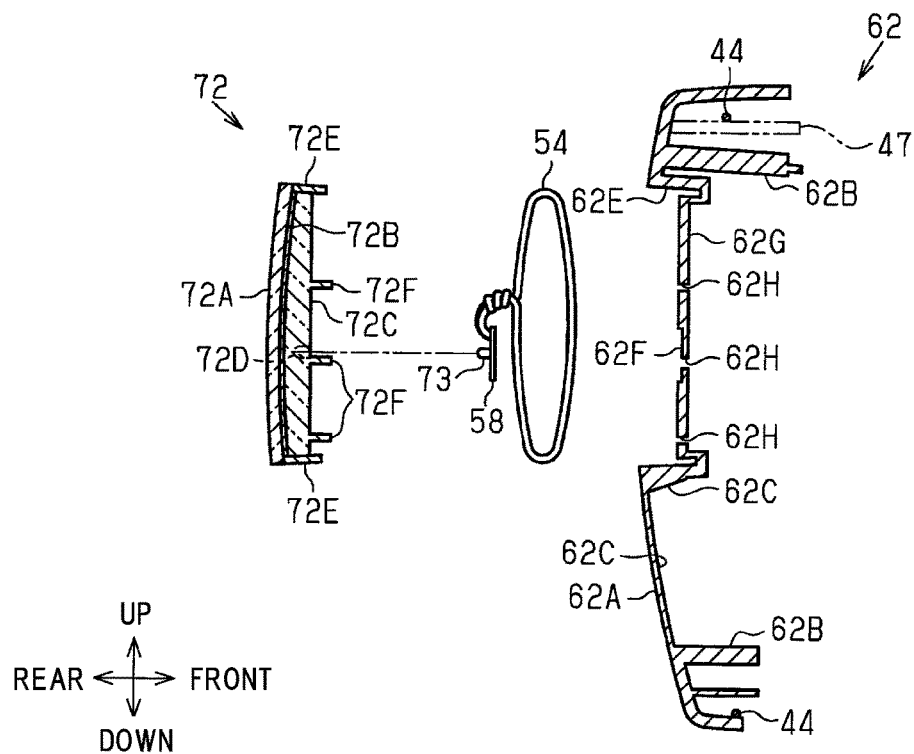
FIG. 8 is an exploded sectional view of the airbag cover, a light emitting display part, and a power receiving part.

As illustrated in FIGS. 6A and 8, the outer skin 62A of the airbag cover 62 is formed at the center part thereof with an emblem concave portion 62E extending in a shape having an approximately oval section. The emblem concave portion 62E is formed at the bottom surface thereof with a concave portion (a board concave portion 62F) having a rectangular sectional shape to which the power reception board 58 is fitted. The emblem concave portion 62E is formed at the bottom wall 62G thereof with a plurality of (13 in the present embodiment) through holes 62H. These through holes 62H are formed at positions corresponding to the legs 72F of the emblem part 72.

As illustrated in FIG. 8, when assembling the airbag cover 62, the legs 72F of the emblem part 72 are inserted into the through holes 62H of the airbag cover 62 in the state in which the power reception board 58 and the aforementioned power reception coil 54 are interposed between the emblem concave portion 62E of the airbag cover 62 and the emblem part 72. Then, the tips of these legs 72F are welded to the bottom wall of the airbag cover 62. In this way, the emblem part 72 is fixed to the airbag cover 62. Furthermore, the light emitting diodes 73 are inserted into the insertion holes 72D of the entire emblem part 72, so that the power reception board 58 is accommodated in the board concave portion 62F of the airbag cover 62. Moreover, the power reception coil 54 connected to the power reception board 58 is arranged between the tip of the peripheral wall 72E of the emblem part 72 and the outer edge of the bottom surface of the emblem concave portion 62E of the airbag cover 62.

Furthermore, the aforementioned power transmission board 47 is fixed to the front surface of the outer edge of the airbag cover 62, and is mounted at the front surface of the airbag cover 62 such that the aforementioned power transmission coil 44 connected to the power transmission board 47 extends along the outer edge of the airbag cover 62 at the outer side of the peripheral wall 72E of the airbag cover 62. When the steering wheel 20 (see FIG. 3) is mounted at the vehicle body 13, the power transmission board 47 is connected to the DC power supply 31 and the electronic control device 32 through the wire harness 37.

Hereinafter, operations according to the light emitting display device of the present embodiment will be described.

Figure 9:
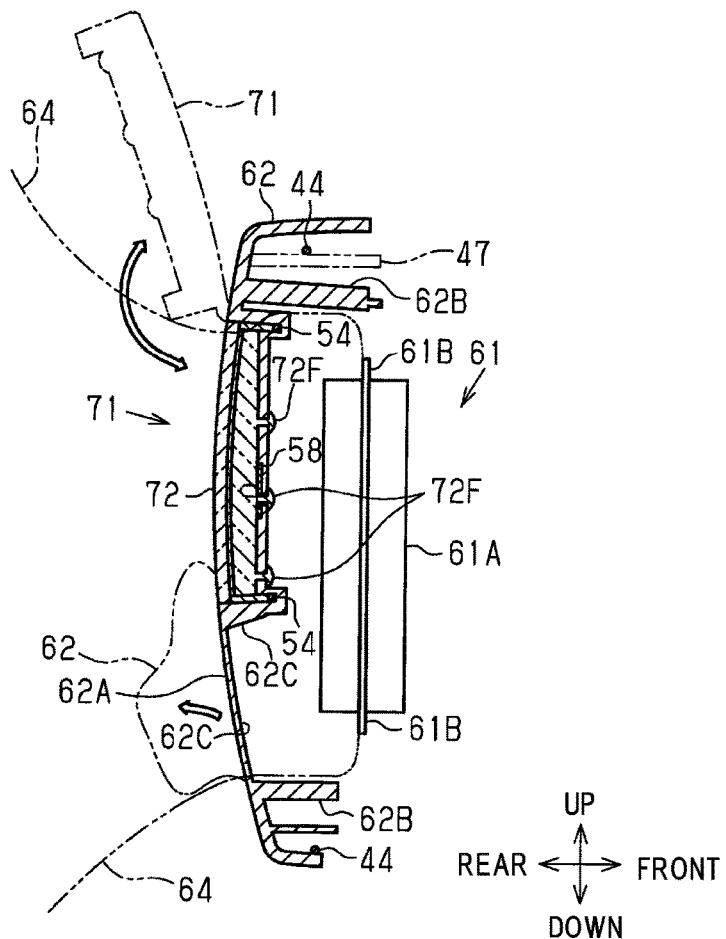
FIG. 9 is an explanation view illustrating a deployment range of an airbag.

As illustrated in FIG. 5, the airbag 64 is accommodated at the front side of the airbag cover 62 in the folded state. As illustrated in FIG. 9, when the airbag 64 is expanded and deployed, the airbag 64 passes through the inside of the peripheral wall 62B of the airbag cover 62, and protrudes outward from the airbag cover 62 by pushing to open the outer skin 62A while breaking through the thin part 62C of the outer skin 62A as indicated by a white arrow of FIG. 9. As apparent from FIG. 9, the deployment range of the airbag 64 around the airbag cover 62 includes the inside of the peripheral wall 62B of the airbag cover 62 and the rear side from the airbag cover 62.

In the present embodiment, the power transmission coil 44 is mounted at the airbag cover 62 to extend at the outer side of the peripheral wall 62B. In this way, the power transmission coil 44 is arranged at a position out of the deployment range of the airbag 64 and does not become an obstacle when the airbag 64 is deployed.

Figure 10:
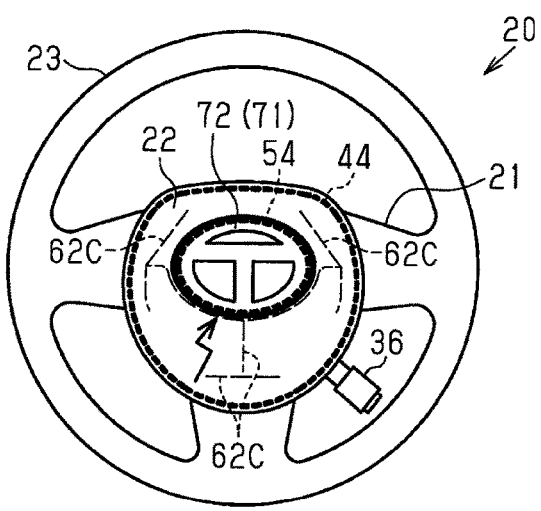
FIG. 10 is a front view of the steering wheel.

As illustrated in FIGS. 9 and 10, power is supplied to the light emitting display part 71 in a non-contact manner using the power transmission coil 44 and the power reception coil 54 provided inside of the peripheral wall 62B (FIG. 9) of the airbag cover 62. Therefore, since there is no wiring for power supply between the power reception coil 54 and the power transmission coil 44 (in detail, the airbag 64 (see FIG. 5) in the folded state and the airbag cover 62), the wiring for power supply does not become an obstacle in the deployment of the airbag 64.

Consequently, although the light emitting display part 71 is provided to the airbag cover 62, it is possible to achieve a structure in which the light emitting display device employing the light emitting display part 71 as one configuration hardly becomes an obstacle when the airbag 64 is deployed.

In the present embodiment, since the airbag device 60 and the light emitting display device are provided in a narrow range (the steering wheel 20), the degree of freedom of the arrangement of these devices is low, so that the distance between the airbag 64 and the light emitting display part 71 is easily shortened. Therefore, when power is supplied to the light emitting display part 71 in a wired manner by providing a wiring for connecting the DC power supply 31 to the light emitting display part 71, the wiring may easily become an obstacle when the airbag 64 is deployed. According to the present embodiment, although the light emitting display device having the light emitting display part 71 is provided to the steering wheel 20, it is possible to achieve a structure in which the device hardly becomes an obstacle when the airbag 64 is deployed.

In the wireless power feeding device 40 including the power reception coil 54 and the power transmission coil 44 and supplying power in a non-contact manner, as the distance between the power reception coil 54 and the power transmission coil 44 is near, power transmission efficiency using the power reception coil 54 and the power transmission coil 44 becomes basically high. In the present embodiment, both the power reception coil 54 and the power transmission coil 44 are provided to the airbag cover 62. Therefore, the power reception coil 54 and the power transmission coil 44 can be arranged at a near position, so that it is possible to perform high efficient power transmission using these power reception coil 54 and power transmission coil 44.

Furthermore, in the present embodiment, as illustrated in FIGS. 4 and 10, the power transmission coil 44 is arranged to extend along the outer edge of the airbag cover 62. In this way, the power transmission coil 44 can be arranged to surround almost the entire of the airbag cover 62. Therefore, in the device in which the power transmission coil 44 is provided to the airbag cover 62, it is possible to increase a range in which power can be transmitted using the power transmission coil 44, so that it is possible to perform power transmission with high degree of freedom.

Furthermore, in the aforementioned wireless power feeding device 40, power can also be supplied to outside in the radial direction of the power transmission coil 44 even in a limited range. According to the present embodiment, power transmission is possible using the power transmission coil 44 inclusive of the outside in the radial direction of the power transmission coil 44. In detail, the power reception coil and the light emitting diode are also provided to supply power to a ring-like part (a ring part 23 (FIG. 10)) grasped by a driver when the steering wheel 20 is operated, and parts between the ring part 23 and the additional equipment 22 from the power transmission unit 41 (the power transmission coil 44) of the wireless power feeding device 40, so that light can be emitted.

In the present embodiment, the supply mode (in detail, the control execution mode of the controller 46) of power to the power transmission coil 44 from the DC power supply 31 is changed by the command signal from the electronic control device 32, so that a voltage of DC power after being rectified by the rectification part 56 of the power reception unit 51 is changed and a light emitting color of the light emitting display part 71 is switched by the switching part 57 based on the voltage. By so doing, the supply mode is adjusted according to the supply of power to the power transmission coil 44 from the DC power supply 31, so that it is possible to set the light emitting color of the light emitting display part 71 with high degree of freedom.

As described above, according to the present embodiment, the following effects are obtained.

(1) Since the power transmission coil 44 is arranged at a position out of the deployment range of the airbag 64, it does not become an obstacle when the airbag 64 is deployed. In addition, since there is no wiring for power supply between the airbag 64 in the folded state and the airbag cover 62, the wiring for power supply does not become an obstacle in the deployment of the airbag 64. Consequently, although the light emitting display part 71 is provided to the airbag cover 62, it is possible to achieve a structure in which the light emitting display device employing the light emitting display part 71 as one configuration hardly becomes an obstacle when the airbag 64 is deployed.

(2) Although the light emitting display device having the light emitting display part 71 is provided to the steering wheel 20, it is possible to achieve a structure in which the device hardly becomes an obstacle when the airbag 64 is deployed.

(3) The power reception coil 54 and the power transmission coil 44 are provided to the airbag cover 62, so that it is possible to perform high efficient power transmission using these power reception coil 54 and power transmission coil 44.

(4) The power transmission coil 44 is mounted at the airbag cover 62 to extend outside the peripheral wall 62B of the airbag cover 62. In this way, the power transmission coil 44 can be arranged to a position out of the deployment range of the airbag 64.

(5) The power transmission coil 44 is arranged to extend along the outer edge of the airbag cover 62. Therefore, in the device in which the power transmission coil 44 is provided to the airbag cover 62, it is possible to increase a range in which power can be transmitted using the power transmission coil 44, so that it is possible to perform power transmission with high degree of freedom.

(6) The supply mode is adjusted according to the supply of power to the power transmission coil 44 from the DC power supply 31, so that it is possible to set the light emitting mode of the light emitting display part 71 with high degree of freedom.

In addition, the aforementioned embodiment may also be performed through the following modifications.

Conditions for deciding the light emitting color of the light emitting display part 71 can be arbitrarily changed. For example, the light emitting display part 71 may also be allowed to emit light with a predetermined color (a red color) for a condition that a vehicle is swung. As described above, the light emitting display part 71 is allowed to emit light, so that a crew member (particularly, a driver) can be notified of the probability of drowsy driving. The fact that the vehicle is swung can be determined based on a detection signal of an acceleration sensor and a detection signal of a steering angle sensor. Furthermore, the light emitting display part 71 may also be allowed to emit light with a predetermined color (a red color) for a condition that an inter-vehicle distance with a preceding vehicle is shortened at the time of normal driving in which automatic driving is not performed. As described above, the light emitting display part 71 is allowed to emit light, so that a driver can be notified of the probability of drowsy driving and the probability of a rear end collision to a preceding vehicle. In addition, the light emitting display part 71 may also be allowed to emit light with a predetermined color (a white color) for a condition that a door has been opened, or a condition that a headlight is turned on.

The light emitting display of the aforementioned embodiment can also be applied to a vehicle in which automatic driving is not performed.

In the aforementioned embodiment, the supply mode of power to the power transmission coil 44 from the DC power supply 31 is adjusted to change a voltage after being rectified by the rectification part 56 of the power reception unit 51, so that the light emitting color of the light emitting display part 71 is switched. Instead, a frequency of high frequency power supplied to the power transmission coil 44 from the DC power supply 31 is adjusted to change a frequency of high frequency power transferred to the resonator 55 of the power reception unit 51, so that the light emitting color of the light emitting display part 71 may also be switched. In this case, it is sufficient if a switching part of the power reception unit 51 is allowed to have a function of switching a power supply mode to the light emitting display part 71 (in detail, the light emitting diode 73) according to the frequency of the high frequency power input from the resonator 55.

Figure 11:
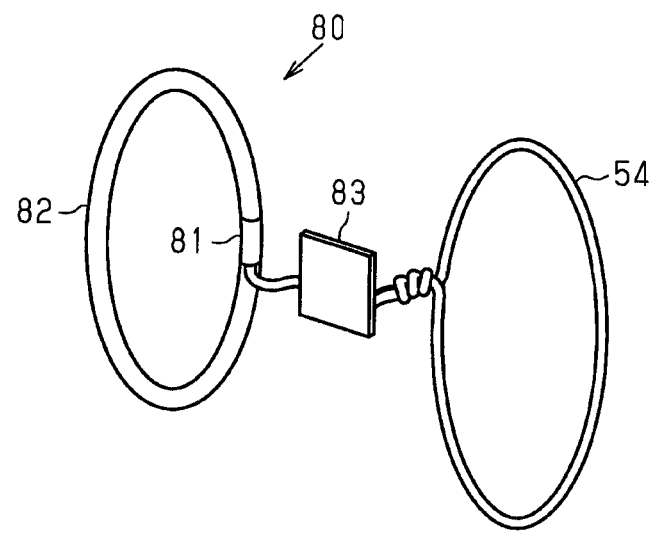
FIG. 11 is a perspective view illustrating a light emitting part of a modification example.

As illustrated in FIG. 11, as a part (a light emitting part 80) that actually emits light in the light emitting display device, it may be possible to employ a part obtained by bending an optical fiber 82, which is mounted at one end thereof with a light emitting diode 81, in a ring shape. In this case, it is sufficient if the light emitting part 80 and the power reception coil 54 are connected to each other through a power reception board 83 having the rectification part 56 (see FIG. 3) and the switching part 57. These light emitting part 80, power reception coil 54, and power reception board 83 are provided between the emblem part 72 (FIG. 8) and the airbag cover 62, so that it is possible to allow the emblem part 72 to emit light.

In addition, the light emitting part 80, the power reception coil 54, and the power reception board 83 may be mounted at the front side of the emblem part 72 at the front side (see FIG. 8) of the airbag cover 62. According to such a mounting structure, light emitted by the light emitting diode 81 is spread inside of the legs 72F and inside of the inner layer part 72C of the emblem part 72 and passes through the outer layer part 72A side through the metal plating layer of the half mirror structure, so that the entire emblem part 72 emits light. In the case of employing the aforementioned mounting structure, it is desired to provide a cover having a shape of covering the outer periphery and the front surface of the light emitting part 80. By providing such a cover, it is possible to suppress light leakage to the outside of the airbag cover 62, so that it is possible to suppress light leakage to the outside of the steering wheel 20 through a gap between the additional equipment 22 and the wheel body 21.

Figure 12:
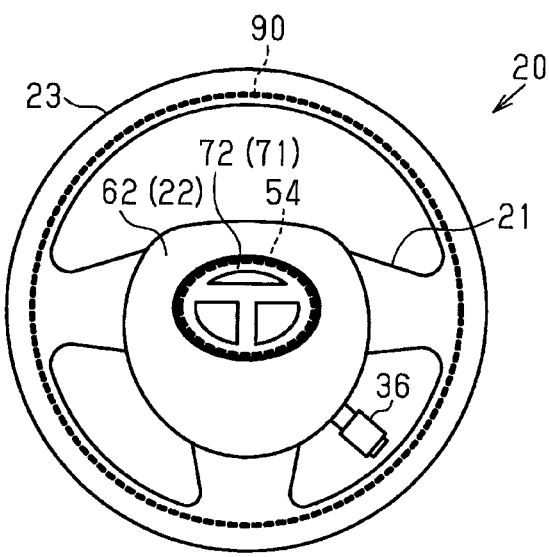
FIG. 12 is a front view of a steering wheel according to another embodiment.

As illustrated in FIG. 12, a power transmission coil 90 of the wireless power feeding device may also be provided to the ring part 23 of the steering wheel 20. According to such a device, as compared with a device in which the power transmission coil is mounted at the airbag cover 62, it is possible to increase a range in which power can be transmitted using the power transmission coil 90, so that it is possible to perform power transmission with high degree of freedom. In this device, it is possible to widen the range, in which power can be transmitted using the power transmission coil 90, to outside in the radial direction of the steering wheel 20. Therefore, it is possible to charge a portable device (for example, a smart phone watch put on an arm of a driver, a cellular phone placed in a holder, and the like) arranged in such a range. In addition, the power transmission coil of the wireless power feeding device may also be provided to the center part of the wheel body 21 of the steering wheel 20.

Figure 13:
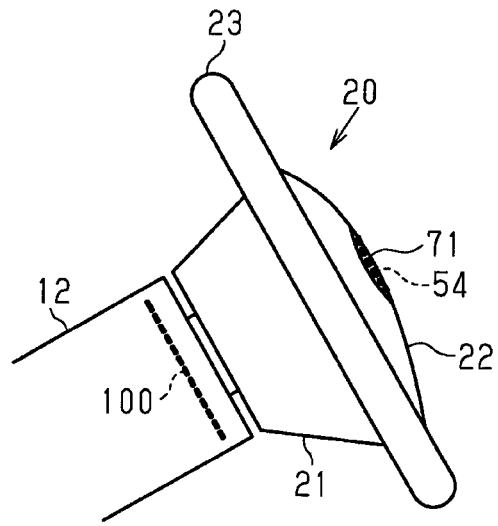
FIG. 13 is a side view of the steering wheel according to another embodiment.

As illustrated in FIG. 13, a power transmission coil 100 of the power feeding device may also be provided to the steering column 12 of the vehicle.

Figure 14:
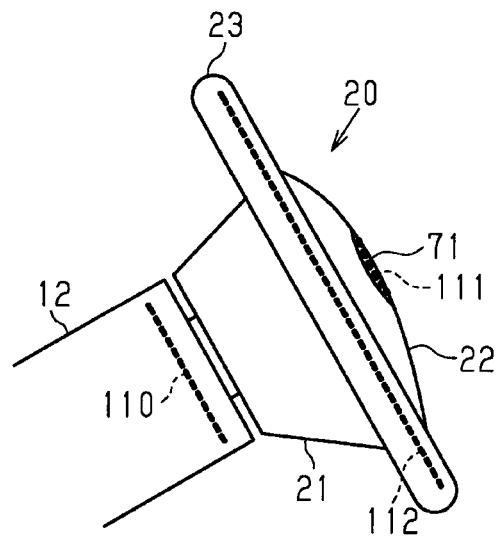
FIG. 14 is a side view of the steering wheel according to another embodiment.

As illustrated in an example of FIG. 14, in a light emitting display device in which a power transmission coil 110 of the wireless power feeding device is mounted at the steering column 12 of the vehicle and a power reception coil 111 of the wireless power feeding device is mounted at the airbag cover 62 of the steering wheel 20, a relay coil 112 may be provided between the power transmission coil 110 and the power reception coil 111. In addition, the relay coil 112 includes a ring-like conductor (a copper wire) and a capacitor (not illustrated) is provided in the middle of the conductor. According to such a device, as compared with a light emitting display device with no relay coil, it is possible to improve power transmission efficiency by the wireless power feeding device. In the example illustrated in FIG. 14, the relay coil 112 is mounted at the ring part 23 of the steering wheel 20. In this way, power can be transmitted to the entire steering wheel 20 and the periphery thereof at high power transmission efficiency, so that it is possible to perform power transmission with high degree of freedom.

Figure 15:
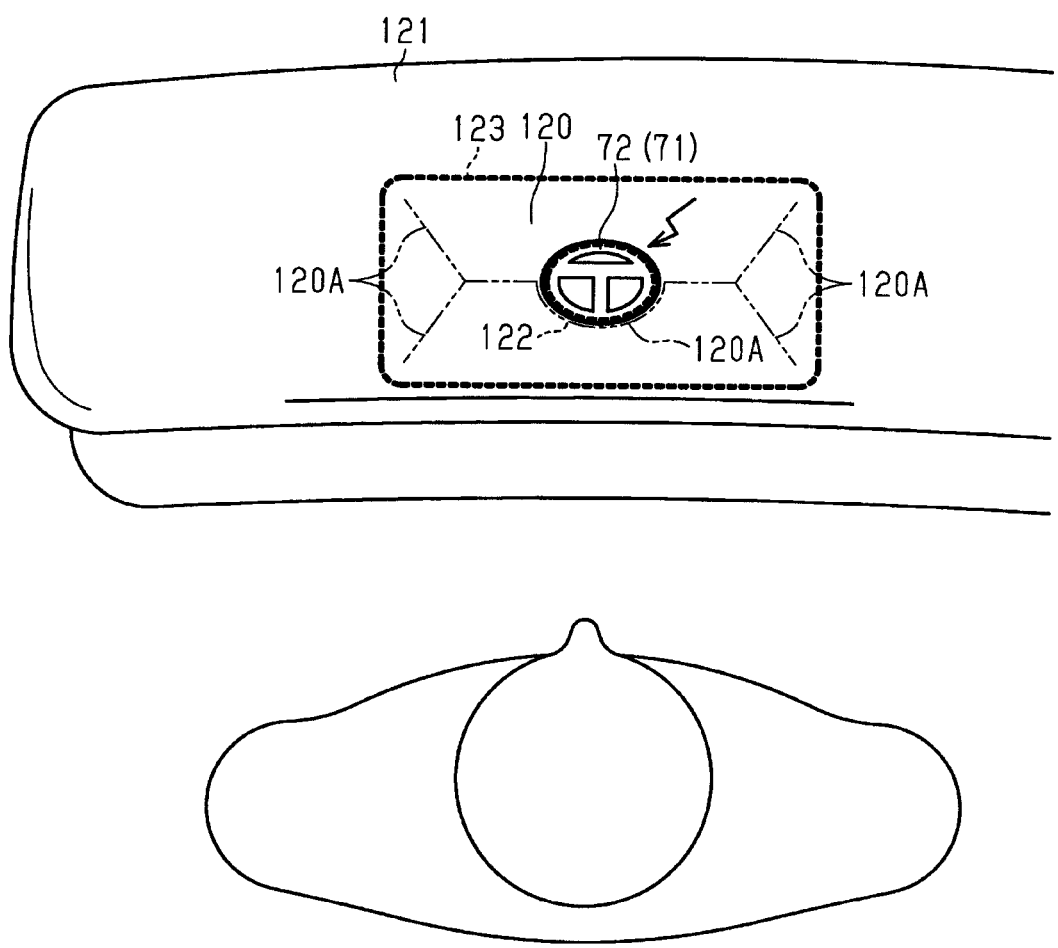
FIG. 15 is a plan view of a dashboard employing a light emitting display part of another embodiment and a periphery thereof.

The light emitting display device of the aforementioned embodiment can also be applied to a vehicle, in which the light emitting display part is provided to an airbag cover of an airbag device for a passenger seat, by appropriately changing the configuration thereof. An example of such a light emitting display device is illustrated in FIG. 15. In the example illustrated in FIG. 15, an airbag cover 120 constitutes a part of an upper wall of a dashboard 121. A power reception coil 122 of the wireless power feeding device is provided to the airbag cover 120 in a state of being integrated with the light emitting display part 71. Furthermore, a power transmission coil 123 of the wireless power feeding device is arranged at a position out of a range in which an airbag is deployed when the airbag device is operated. In detail, the airbag cover 120 is provided with a thin part 120A which is broken through by the airbag when the airbag is expanded, and the power transmission coil 123 is arranged to surround a movable part (in detail, a range in which the thin part 120A is formed) which is pushed to open when the airbag is expanded.

In addition, the light emitting display device of the aforementioned embodiment can also be applied to a vehicle, in which the light emitting display part is provided to an airbag cover of a curtain airbag device, a vehicle, in which the light emitting display part is provided to an airbag cover of a side airbag device, and the like by appropriately changing the configuration thereof.

As the light emitting display part provided to the airbag cover, it is possible to employ an arbitrary device if it performs light emitting display by supplied power such as a display for displaying an image, as well as the light emitting display part 71 including the emblem part 72 and the light emitting diode 73. In addition, in the case of employing a display as the light emitting display part, an image or a video to be displayed on a screen can be employed as a light emitting mode of the light emitting display part, as well as the employment of a light emitting color used for allowing the screen to emit light.

What is claimed is:

1. A light emitting display device, which is applied to a vehicle provided with an airbag device having an airbag accommodated in a folded state and an airbag cover with a shape of covering a vehicle interior of the airbag, the light emitting display device comprising:
   a light emitting display part provided to the airbag cover, the light emitting display part configured to emit light using supplied power; and
   a power feeding device including a power reception coil and a power transmission coil, the power feeding device configured to supply power to the light emitting display part in a non-contact manner, wherein:
   the power reception coil is provided to the airbag cover in a state of being integrated with the light emitting display part;
   the power transmission coil is arranged at a position out of a range, in which the airbag is deployed, when the airbag device is operated; and
   the power transmission coil is provided to the airbag cover.

2. The light emitting display device according to claim 1, wherein:
   the airbag cover has a cylindrical peripheral wall, which is provided to protrude at a surface of a side of the airbag to surround a periphery of the airbag;
   the power transmission coil is provided to extend outside the peripheral wall; and
   the power reception coil and the light emitting display part are provided inside the peripheral wall.

3. The light emitting display device according to claim 1, wherein
   the power transmission coil is arranged to extend along an outer edge of the airbag cover.

4. A light emitting display device, which is applied to a vehicle provided with an airbag device having an airbag accommodated in a folded state and an airbag cover with a shape of covering a vehicle interior of the airbag, the light emitting display device comprising:
   a light emitting display part provided to the airbag cover, the light emitting display part configured to emit light using supplied power; and
   a power feeding device including a power reception coil and a power transmission coil, the power feeding device configured to supply power to the light emitting display part in a non-contact manner, wherein:

the power reception coil is provided to the airbag cover in a state of being integrated with the light emitting display part;
the power transmission coil is arranged at a position out of a range, in which the airbag is deployed, when the airbag device is operated; and
the light emitting display device further comprises:
a power change unit configured to change a supply mode of power to the power transmission coil; and
a light emitting change unit configured to change a light emitting mode of the light emitting display part according to power received by the power reception coil.

5. A light emitting display device, which is applied to a vehicle provided with an airbag device having an airbag accommodated in a folded state and an airbag cover with a shape of covering a vehicle interior of the airbag, the light emitting display device comprising:

a light emitting display part provided to the airbag cover, the light emitting display part configured to emit light using supplied power; and
a power feeding device including a power reception coil and a power transmission coil, the power feeding device configured to supply power to the light emitting display part in a non-contact manner, wherein:
the power reception coil is provided to the airbag cover in a state of being integrated with the light emitting display part;
the power transmission coil is arranged at a position out of a range, in which the airbag is deployed, when the airbag device is operated; and
the light emitting display part includes an emblem and a light emitting diode for allowing the emblem to emit light.

* * * * *